United States Patent [19]

Pharney

[11] 4,144,487
[45] Mar. 13, 1979

[54] ELECTRICAL CABLE FAULT LOCATING APPARATUS

[75] Inventor: Julian R. Pharney, Reynoldsburg, Ohio

[73] Assignee: Bell Telephone Laboratories, Incorporated, Murray Hill, N.J.

[21] Appl. No.: 850,918

[22] Filed: Nov. 14, 1977

[51] Int. Cl.$^2$ .......................................... G01R 31/10
[52] U.S. Cl. ................... 324/52; 179/175.3 F
[58] Field of Search .................. 324/52, 54; 179/175.3 F

[56] References Cited

U.S. PATENT DOCUMENTS

| | | | |
|---|---|---|---|
| 2,707,267 | 4/1955 | Gavin | 324/52 |
| 3,488,580 | 1/1970 | Anderson et al. | 324/52 |

FOREIGN PATENT DOCUMENTS 1022320  1/1958  Fed. Rep. of Germany ............ 324/54

OTHER PUBLICATIONS

Capacitor Discharge Generators and Cable Burning Equipment, *Electrical Review*, vol. 199, No. 20, Nov. 19, 1976 pp. 38 and 41.
Maloney, Charles A., Locating Cable Faults IEEE Transactions on Industry Applic. vol. IA-9, No. 4, Jul./aug. 1973 pp. 380-394.

*Primary Examiner*—Gerard R. Strecker
*Attorney, Agent, or Firm*—William H. Kamstra

[57] ABSTRACT

A fault locating apparatus for locating high resistance leaks in telephone subscriber lines comprising circuitry for initially applying a low voltage to the line to ensure that the insulation and conductors are dry at the fault zone. When the drying is completed as indicated by a zero reading on an ammeter connected in the circuit, further circuitry is actuated to apply a brief high voltage to the line to cause a brief arc discharge at the fault. At this point, two operative options are made possible. The peak current flow during the arc may be read on a second ammeter providing a measure of the distance to the fault and the apparatus is disconnected or the low voltage application may be continued to sustain the arc until a weld is created at the fault between the line conductors. A feature of the apparatus is a timing circuit which controls means for applying a reverse potential to the line thereby extinguishing the arc at the fault while simultaneously inducing a weld between the conductors there. A reversing switch is also provided to reverse the polarities of the voltages as applied to the subscriber line conductors in a subsequent operation should the first attempt at creating a weld have been unsuccessful.

10 Claims, 2 Drawing Figures

ELECTRICAL CABLE FAULT LOCATING APPARATUS

BACKGROUND OF THE INVENTION

This invention relates to telephone cable repair apparatus and more particularly to such apparatus for locating high resistance faults in the conductors of telephone cables.

The problem of high resistance faults or leaks in telephone cables extending between a central office and its subscriber stations is well-known and may arise as the result of a number of causes, both natural and manmade. Damage to the cable and conductor insulation as the result, for example, of temperature extremes, rodent attack, maintenance negligence, and the like, can permit moisture seepage to establish a high resistance leak between a tip and ring conductor. Whatever the cause, the leaks must be promptly repaired to ensure continuous subscriber service. However, before the leak or fault can be repaired it must first be found and this has frequently presented the major maintenance problem.

One well-known method of pinpointing resistive faults has been the application of a breakdown voltage to the faulty line. The line is first disconnected at the central office and at the subscriber station. Test circuitry is then connected to the tip and ring conductor pair, which circuitry applies a breakdown voltage of the order of 600 volts to the now floating line. As a result the line is caused to breakdown at the fault, thereby creating an arc discharge. The discharge burns away the conductor insulation, typically pulp, and welds the two conductors with molten copper. Once the short circuit between the two conductors is created, a tone signal is applied to the line and is traced to the fault with an exploring coil.

Although a relatively simple procedure, the process of breaking down a faulty line itself has a number of drawbacks. Whether or not a positive weld between the two conductors has been formed is almost impossible to determine. Thus, if the weld was imperfectly formed and is broken before the fault is located, the exploring coil may be passed beyond the point of the fault. The breakdown method also presents a safety hazard to maintenance personnel and to office equipment. Any inadvertent contact with the line or connection to office equipment during the application of the high breakdown voltage could result in injury or equipment damage. The application of a relatively high voltage for unnecessarily long durations to a line having a fault at one point may also cause a breakdown at a second point where an incipient fault exists. Sustained arc durations at the fault can yield unnecessary extensive proximity conductor damage from burning insulation.

It is accordingly one object of this invention to ensure a weld during the operation of breakdown test apparatus in the location of faults in telephone cables.

Another object of this invention is the reduction of risk of injury and equipment damage during the application of a high voltage during the breakdown testing of faulty telephone cables.

It is also an object of this invention to reduce the probability of fire damage to proximity conductors at the fault.

Still another object of this invention is to provide a new and novel test apparatus for locating faults in telephone subscriber lines.

SUMMARY OF THE INVENTION

The foregoing and other objects of this invention are realized in one illustrative embodiment thereof which offers a number of options in locating high resistance faults in telephone subscriber lines. Assuming that, somewhere between the central office and a subscriber station, moisture seepage at an insulation perforation has caused a high resistance leak between a ring and tip conductor, circuitry is provided for initially applying a relatively low voltage (on the order of 200 volts) across the conductors. This voltage causes a drying action at the fault which increases the resistance there while simultaneously lowering the breakdown potential at the fault, that is, the ability of the applied voltage to cause an arc discharge at the fault between the conductors. An ammeter connected in the line under test reading near zero amperes indicates when the line at the fault is sufficiently dry, at which time the drying voltage is disconnected. A second circuit section of the test apparatus including a substantially higher voltage source (of the order of 1000 volts) is now controlled to briefly apply the latter voltage to the line. At this point, two operative options are offered by a test apparatus of the invention. In a first option, the current surge resulting from the application of the brief high voltage is read from a second ammeter and constitutes a measure of the distance from the test apparatus to the fault in the line. The applied high voltage ignites an arc discharge at the fault which is of short duration and unsustained.

In a second operative option, after the short duration, high voltage application and the ignition of an arc discharge at the fault, the test apparatus according to the invention is controlled to permit the previously mentioned lower voltage to sustain the arc discharge until a weld between the ring and tip conductors is achieved. A voltmeter indicating 0 volts indicates a successful weld between the conductors. The previously mentioned second ammeter under the former option also reads the distance from the test apparatus to the weld. This helps reduce the time required to pinpoint the fault with the exploring coil. One novel feature of a test apparatus according to the present invention is circuitry for forcing the weld between the conductors. A timing circuit is provided which controls, after a preset interval, a voltage reversing means which reverses the polarity of the low arc discharge sustaining voltage that is across the tip and ring conductors. As a result, the arc at the fault is extinguished while simultaneously, as a result of a phenomenon not completely understood, a weld is forced between the conductors at the fault point. This advantageous inducement of a weld may be the result of an electrostatic or a snap action on the pool of molten copper on the anode conductor. Forced extinction of the arc thus advantageously serves to minimize the total energy required to create a weld and hence reduces the probability of fire damage.

If, in spite of the afore-mentioned attempts to create a weld at the cable fault, one is not achieve, the arc discharge and welding process may be repeated. The probability of success of a second attempt is increased by a switch means for reversing the connection of the test apparatus to the ring and tip conductors. In the previous attempt, the arc formed molten copper on the anode conductor to create a small mound at the arcing point. With the connections reversed, the other conductor becomes the anode and forms the molten copper. This is now more readily accomplished since the distance for the arc discharge is shorter and the copper at the now anode conductor is more readily melted than at the now cooled previously molten mound.

As briefly described in the foregoing, a fault locating test apparatus according to the present invention advantageously reduces the risk of injury and equipment damage by limiting the application of the high voltage arc discharge ignition voltage to the order of microseconds. The reliability of weld formation is also significantly enhanced by providing circuit means for forcing the formation of a weld and for facilitating its formation on a second attempt. The versatility of the test apparatus is also demonstrated by the optional modes of operation offered and the incorporation of range finding means for measuring the distance from the central office to the arc discharge and/or weld at the cable fault.

BRIEF DESCRIPTION OF THE DRAWING

The foregoing and other objects and features of a fault locating test apparatus according to the principles of this invention will be better understood from a consideration of the detailed description of the organization and operation of one specific illustrative embodiment thereof which follows when taken in conjunction with the accompanying drawing in which.

DETAILED DESCRIPTION

Figure 1:
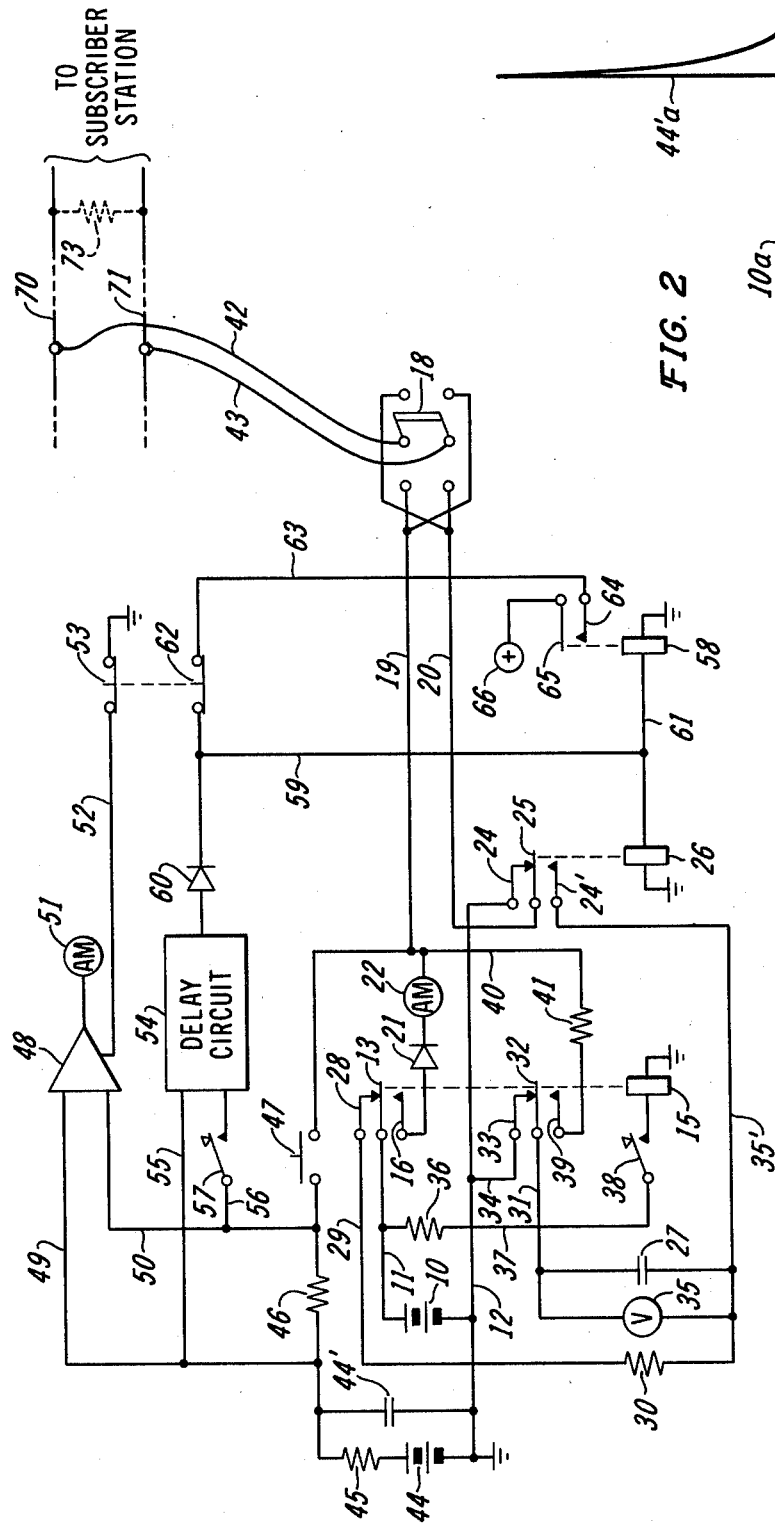
FIG. 1 depicts in schematic representation the circuit details of a fault locating test apparatus according to the present invention.

A description of the circuit details of the illustrative telephone cable fault locating test apparatus according to the present invention as depicted in FIG. 1, is best organized in accordance with the cooperative functions performed. As will appear hereinafter, an initial step in the operation of the test apparatus is the application of a relatively low voltage to the ring and tip conductors of a subscriber line under test. This low voltage on the order of 200 volts, is provided by a voltage supply 10 which is connected by means of its terminals to a pair of conductors 11 and 12, conductor 11 being in turn connected to a contact spring 13 operated by a relay 15. A make contact 16 of the same relay is closeable by spring 13 to extend conductor 11 to one terminal of a reversing switch 18 at the output end of the test apparatus via a further conductor 19. The connection to conductor 19 is made via a diode 21 and an ammeter 22. Conductor 12 is extended to a second terminal of switch 18 via a normally closed break contact 24 and a contact spring 25 of a relay 26, and a further conductor 20.

Returning to voltage supply 10 and its circuit connections, a capacitor 27 is seen as connected thereacross at one end by means of conductor 11, contact spring 13 of relay 15, a break contact 28 of the same relay, a conductor 29, and a resistor 30. At the other end of supply 10 capacitor 27 is connected thereto via a conductor 31, a contact spring 32 of relay 15, a break contact 33 of the same relay, a conductor 34, and conductor 12. A voltmeter 35 is in this manner also connected across capacitor 27 and across voltage supply 10 via resistor 30, normally closed break contact 28 and contact spring 13 of relay 15. Capacitor 27 and voltmeter 35 are also connected at the resistor 30 connection to a make contact 24' of relay 26 via a conductor 35'. An energizing circuit for relay 15 may be traced from one terminal of voltage supply 10 to ground via conductor 11, a resistor 36, a conductor 37, and the contacts of a normally open switch 38. Conductor 19 is connected between ammeter 22 and reversing switch 18 to a final make contact 39 of relay 15 via a conductor 40 and a resistor 41. At the output end of the exemplary test apparatus, reversing switch 18 comprises a double-pole, double-throw switch which, in a first closed position, connects conductors 19 and 20 directly to a pair of output leads 42 and 43, respectively. In its other closed position, switch 18 reverses these connections to connect conductors 19 and 20 to output leads 43 and 42, respectively.

In another step in the operation of a test apparatus according to this invention, a second, higher voltage may be applied via output leads 42 and 43 to a subscriber line under test. This voltage, in the order of 1000 volts, is provided by a second voltage supply 44 connectable across conductors 19 and 20, respectively, via a first and a second resistor 45 and 46, and a normally open switch 47 at one terminal and conductor 12, contact 24, and contact spring 25 at its other terminal. Connected across both resistor 45 and voltage supply 44 is a capacitor 44'.

Another circuit grouping of a test apparatus according to the present invention accomplishes a range finding function and comprises a peak detector circuit 48 having a pair of inputs connected across resistor 46 of the high voltage supply by means of a pair of conductors 49 and 50. Peak detector circuit 48 may comprise any well-known sample-hold circuit which retains peak voltage value inputs and controls the reading of a range ammeter 51. A reset circuit for detector circuit 48 is provided to ground via a conductor 52 and a normally closed, ganged switch 53. This circuit grouping also includes a timing circuit comprising a delay circuit 54 having a pair of inputs connected to conductors 49 and 50 by means of conductors 55 and 56, respectively, the latter conductor including a normally open switch 57. Delay circuit 54 generates a brief output signal which is employed to operate a pair of relays: previously mentioned relay 26 and a relay 58, via a diode 60, a conductor 59, and a conductor 61. At the output of the delay circuit 54, a latching circuit is provided for relay 26 under the control of relay 58 which circuit may be traced from diode 60 via a normally closed switch 62 ganged with switch 53, a conductor 63, a make contact 64 of relay 58, and a contact spring 65 of the same relay to a source of potential 66.

With the foregoing circuit organization of one illustrative fault location apparatus according to this invention in mind, particular operations thereof may now be described. For this purpose the test apparatus of FIG. 1 is shown as being temporarily connected via output leads 42 and 43 to a subscriber line comprising ring and tip conductors 70 and 71, between which conductors exists a high resistance leak 73. Before the connection of the test apparatus, the line is disconnected at both the central office and the subscriber station. The test apparatus, which may be employed at the central office or at a point nearer to the fault, may be operated in two modes: in a first, only a short duration arc discharge is caused at the fault and in a second mode, the arc discharge is sustained and is followed by a weld formed at the fault. In each case, the range to the fault may be determined. The former operation will first be considered.

Figure 2:
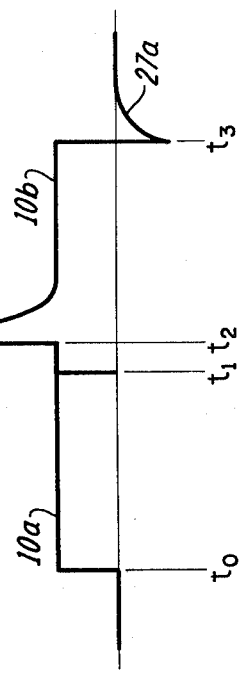
FIG. 2 depicts an idealized waveform of the tip to ring conductor voltage values at particular times during exemplary operations of the apparatus of FIG. 1.

Each of the switches are initially open and to initiate a test operation, reversing switch 18 is closed to connect conductors 19 and 20 directly to output leads 42 and 43 and thereby to ring and tip conductors 70 and 71, respectively. Switch 57 is then closed to prepare the delay circuit. Ganged switches 53 and 62 are then momentarily operated and released to prepare the ranging circuit and to initialize the states of relays 58 and therefore relay 26 so that conductor 12 is connected to conductor 20 through springs 24 and 25. A first step in both operative modes is to ensure that the insulation and conductors at the fault are dry. Accordingly, switch 38 is operated to its closed position to complete an energizing circuit for relay 15 from voltage source 10 via conductor 11, resistor 36, and conductor 37. The resulting operation of relay 15 connects source 10 across conductors 19 and 20 and ultimately thereby, across line conductors 70 and 71 via now closed contacts 13 and 16 of relay 15. The resulting application of 200 volts across line conductors 70 and 71 causes a drying action at the fault which increases the resistance at the fault while simultaneously decreasing the breakdown potential required to produce an arc discharge between the conductors at the fault. A reading of substantially zero on ammeter 22 indicates that the fault zone is dry. Switch 38 is now restored to its open position, thereby releasing relay 15 which opens contacts 13 and 16 to remove the 200-volt drying potential from the subscriber line. This potential is shown in FIG. 2 as waveform 10a occurring between times $t_0$ and $t_1$.

Capacitor 44' is charged to the value of voltage supply 44, that is 1000 volts, and this potential is now applied to the ring and tip conductors 70 and 71 by the closure of switch 47 which is the next step in the operative mode being described. The charge on capacitor 44' is applied to conductors 70 and 71 via paths which may be traced as follows: from the positive side of resistor 45 via resistor 46, switch 47, conductor 19, switch 18, and output lead 42; from the negative side of supply 44 via conductor 12, contacts 24 and 25 of relay 26, conductor 20, switch 18, and output lead 43. The application of the voltage on capacitor 44' occurring at time $t_2$ as indicated by waveform 44'a in FIG. 2, to the line is of very short duration, on the order of microseconds, as determined by the time constant of capacitor 44', and the total resistance of resistor 46, plus the resistance of the subscriber line to the fault. As a result, the arc discharge caused at leak 73 is also of short duration and is nonsustaining for this operative mode. The resulting voltage surge across resistor 46 is inversely proportional to the value of resistor 46 plus the resistance of the subscriber line to the high resistance leak. Accordingly, the voltage surge as sampled by peak detector 48 and read on meter 51, is a measure of the distance to the fault. At this time switch 47 is opened and ganged switches 53 and 62 are momentarily operated and released to reset peak detector 48 by removing ground off conductor 52 and to reset via switch 62 the states of relays 58 and hence, relay 26 so that conductor 12 is connected to conductor 20 through springs 24 and 25 of relay 26.

In a second optional mode of operation, the test apparatus of FIG. 1 is connected to subscriber line conductors 70 and 71 as described in the foregoing and reversing switch 18 is again closed to connect in the test apparatus. Switch 57 is closed in preparation for the actuation of delay circuit 54 and switch 38 is again closed to apply the 200 volts of supply 10 to the ring and tip conductors 70 and 71 to dry the fault zone also as described hereinbefore. When the fault zone is sufficiently dry as indicated by a zero reading on ammeter 22, switch 38 is left in its closed position and relay 15 remains in its operated state. Although one side of capacitor 27 is connected to conductor 19 via conductor 31, closed contacts 32 and 39 of relay 15, and resistor 41, capacitor 27 remains charged to the value of supply 10 in view of the now open contacts 13 and 28 of relay 15 and the normally open contacts 25 and 24' of relay 26. As in the foregoing mode of operation, switch 47 is now operated to apply the charge on capacitor 44' (substantially 1000 volts) to the subscriber line again as indicated in FIG. 2 by waveform 44'a occurring at time $t_2$. With the voltage of supply 10 still applied to the line, the line potential is permitted to rise to the value of supply 44 as the result of the back-biasing of diode 21. Upon the application of the capacitor 44' charge, an arc discharge is ignited between ring and tip conductors 70 and 71 at the leak 73 and the distance to the leak may again be measured by the current surge reading on ammeter 51. When the potential on the line drops below the level of supply 10 which takes place in the order of microseconds, diode 21 again conducts and current from supply 10 sustains the arc discharge at the fault as indicated in FIG. 2 by waveform 10b. Switch 47 is now again opened.

At the same time, an arc discharge is ignited at the fault, the voltage across resistor 46 triggers delay circuit 54 via conductors 55 and 57 and closed switch 57. After a preset time interval (in practice, 0.5 seconds was found suitable) a signal from circuit 54 is transmitted via diode 60 and conductors 59 and 61 to operate relays 26 and 58. The operation of relay 26 opens contact 24 and closes contact 24', thereby disconnecting conductor 20 and line conductor 71 from a direct connection with one side of voltage supply 10. At the same time, previously charged capacitor 27 is connected across conductors 19 and 20 and ultimately line conductors 70 and 71 in a polarity reverse from that of originally voltage supply 10 is still closed contacts 32 and 39 of relay 15, resistor 41 and conductor 40, and now closed contact 24' and 25 of relay 26. Since the output signal of delay circuit 54 is of finite duration, the operation of relay 58 closes a latching circuit for relay 26 from voltage source 66 via closed contacts 64 and 65, conductor 63, normally closed switch 62 and conductors 59 and 61. The application of the capacitor 27 reverse charge to the line (indicated in FIG. 2 by waveform 27a occurring at time $t_3$) extinguishes the arc at the fault and simultaneously induces a welding action there. Although the phenomenon is not fully understood, the weld between the two line conductors is believed induced either by electrostatic action or a mechanical snap action on the molten pool formed on the anode line conductor. Advantageously, the forced extinction of the arc serves to minimize the total energy required to be provided by voltage supply 10 in order to create a weld between the line conductors. It also reduces the probability of fire damage to adjacent tip ring pairs. If a weld has been formed at the fault by the discharge of capacitor 27, this fact will be evidenced by voltmeter 35 which will read 0 volts. At this time ganged switches 53 and 62 are opened to reset peak detector circuit 48 and open the energizing circuits for relays 26 and 58. The remaining switches still closed may now be opened, the opening of switch 38 releasing relay 15.

If, as the result of the afore-described operation, a weld was not successfully formed at the fault in the subscriber line, the operation may be repeated. In the second attempt, however, switch 18 is closed to its second position to reverse the connection of the test apparatus to the subscriber line, that is, conductors 19 and 20 are now connected to output leads 43 and 42, respectively. During the previous attempt at forming a weld, the arc discharge formed molten metal only on the conductor acting as the anode. By reversing the polarity of the high voltage, the creation of a weld in the second attempt is more readily achieved for two reasons. The molten metal on the previous anode conductor has been cooled in the form of a small cone or mound thus shortening the distance of the arc discharge. Also molten metal is more readily formed on the present anode conductor than at the cooled previously molten metal area.

As described in the foregoing, a number of advantages are realized by a fault locating test apparatus according to the present invention. For example, by limiting the application of the high, arc discharge ignition voltage to a brief interval, risk of injury and damage to equipment is substantially reduced. Also by providing two means for reversing the polarity of the applied voltages, the time required for the creation of a weld at a cable fault is reduced and the probability of creating a weld is significantly enhanced. Also because of the latter, damage to other nearby tip-ring pairs caused by unnecessarily sustained arc durations is virtually eliminated. Furthermore, the new range finding feature helps to facilitate the pinpointing of the exact location of the fault with the exploring coil.

What has been described is considered to be only one specific illustrative fault locating test apparatus according to the principles of this invention. Accordingly, it is to be understood that various and numerous other arrangements and modifications may be made therein by one skilled in the art without departing from the spirit and scope of the invention. As one modification, for example, voltage supplies 10 and 44 may be provided as adjustable to offer a range of voltages to correspond to varying distances between the connection of the apparatus and the cable fault. The scope of the invention is thus to be understood as limited only as defined in the accompanying claims.

What is claimed is:

1. Apparatus for locating a fault in an electrical cable comprising a first potential source connectable across conductors of said cable for applying a first potential across said conductors for drying moisture at said fault, a second potential source connectable across said conductors for applying a second potential across said conductors several times greater than said first potential for igniting an arc discharge across said conductors at said fault, means for determining the distance from said apparatus to said fault including means for measuring the peak current of said arc discharge, timing means energized responsive to the application of said second potential for generating a delay signal and means responsive to said delay signal for disconnecting said first potential source from said conductors and for applying a reverse potential to said conductors for extinguishing said arc discharge and simultaneously inducing a weld between said conductors at said fault.

2. Apparatus as claimed in claim 1 also comprising means for disconnecting said first potential source from said conductors when said moisture at said fault is dried.

3. Apparatus as claimed in claim 1 also comprising circuit means for maintaining said first potential across said conductors during the application of said second potential for sustaining said arc discharge.

4. Apparatus as claimed in claim 1 in which said second potential source comprises a capacitor.

5. Apparatus as claimed in claim 4 in which said reverse potential source comprises a capacitor connected across said first potential source.

6. Apparatus for locating a leak between a pair of conductors of an electrical cable comprising a pair of output conductors connectable to said pair of cable conductors, a first potential source connectable across said pair of output conductors for applying a first potential across said cable conductors for drying moisture at said leak, a second potential source connectable across said pair of output conductors for applying a short duration second potential across said cable conductors several times greater than said first potential for causing an arc discharge across said cable conductors at said leak, means for determining the distance from said apparatus to said leak comprising means for detecting the peak current through said arc discharge and means for measuring said peak current, timing means energized responsive to the application of said second potential for generating a delay signal, a reverse potential source, and means responsive to said delay signal for disconnecting said first potential source from said output conductors and for applying said reverse potential source across said output conductors.

7. Apparatus as claimed in claim 6 also comprising means for disconnecting said first potential source from said output conductors when said moisture at said leak is dried and before the application of said second potential across said output conductors.

8. Apparatus as claimed in claim 6 in which said reverse potential source comprises a capacitor connected across said first potential source.

9. Apparatus as claimed in claim 8 also comprising switch means for reversing connections between said output conductors and said cable conductors.

10. Apparatus for locating a resistive leak between a pair of cable conductors of a telephone cable comprising a pair of output conductors connectable to said pair of cable conductors, a first potential source for generating a potential of a first magnitude, a first capacitor connected across said first potential source charged to said potential of said first magnitude, means for connecting said first potential source across said pair of output conductors, a second potential source for generating a potential of a second magnitude several times greater than said first magnitude, a second capacitor connected across said second potential source charged to said potential of said second magnitude, means for applying this charge on said second capacitor across said pair of output conductors to cause an arc discharge at said leak between said pair of cable conductors, timing circuit means energized responsive to said application of said charge on said second capacitor across said pair of output conductors for generating a delay signal, and means responsive to said delay signal for disconnecting said first potential source from said pair of output conductors and for simultaneously connecting said first capacitor across said pair of output conductors in a polarity opposite from the polarity of said first potential source.

* * * * *